United States Patent
Tanaka et al.

(10) Patent No.: US 11,646,332 B2
(45) Date of Patent: May 9, 2023

(54) PHOTOSENSITIVE ASSEMBLY, PHOTOGRAPHING MODULE, AND PHOTOSENSITIVE ASSEMBLY JOINTED BOARD AND CORRESPONDING MANUFACTURING METHOD THEREOF

(71) Applicant: Ningbo Sunny Opotech Co., Ltd., Zhejiang (CN)

(72) Inventors: Takehiko Tanaka, Zhejiang (CN); Bojie Zhao, Zhejiang (CN); Ye Wu, Zhejiang (CN); Zhewen Mei, Zhejiang (CN); Mingzhu Wang, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 392 days.

(21) Appl. No.: 16/954,724

(22) PCT Filed: Dec. 18, 2018

(86) PCT No.: PCT/CN2018/121812
§ 371 (c)(1),
(2) Date: Jun. 17, 2020

(87) PCT Pub. No.: WO2019/120197
PCT Pub. Date: Jun. 27, 2019

(65) Prior Publication Data
US 2020/0388641 A1  Dec. 10, 2020

(30) Foreign Application Priority Data

Dec. 19, 2017 (CN) .......................... 201711378319.8
Dec. 19, 2017 (CN) .......................... 201721782486.4

(51) Int. Cl.
*H01L 27/146* (2006.01)
*H04N 5/225* (2006.01)

(52) U.S. Cl.
CPC .. *H01L 27/14618* (2013.01); *H01L 27/14636* (2013.01); *H01L 27/14687* (2013.01);
(Continued)

(58) Field of Classification Search
CPC ......... H01L 27/14618; H01L 27/14636; H01L 27/14687; H01L 27/146; H01L 27/14634;
(Continued)

(56) References Cited

U.S. PATENT DOCUMENTS

2008/0055438 A1  3/2008 Lee et al.
2012/0249822 A1  10/2012 Yoshida et al.
(Continued)

FOREIGN PATENT DOCUMENTS

CN    105704354    6/2016
CN    205961279    2/2017
(Continued)

OTHER PUBLICATIONS

International Search Report dated Feb. 27, 2019 in International (PCT) Application No. PCT/CN2018/121812.

*Primary Examiner* — John P. Dulka
(74) *Attorney, Agent, or Firm* — Wenderoth, Lind & Ponack, L.L.P.

(57) ABSTRACT

A photosensitive assembly includes a circuit board, a photosensitive element mounted on the circuit board and including a first edge, a first metal wire electrically connecting the photosensitive element and the circuit board and spanning the first edge, a first electronic element mounted on the circuit board and having a mounting area corresponding to an extension line of the first edge, and a molding portion formed on the circuit board, surrounding the photosensitive element, extending to the photosensitive element, covering the first electronic element and the first metal wire, and contacting with a surface of the photosensitive element. Also (Continued)

included are a corresponding camera module, a photosensitive assembly jointed panel and a manufacturing method thereof. The damage risk of a gold wire in a molding process can be reduced to a certain extent without adding additional components and changing a die.

17 Claims, 4 Drawing Sheets

(52) U.S. Cl.
CPC ......... *H04N 5/2252* (2013.01); *H04N 5/2253* (2013.01); *H04N 5/2257* (2013.01)

(58) Field of Classification Search
CPC ........... H01L 27/14605; H01L 27/1461; H01L 27/1462; H04N 5/2252; H04N 5/2253; H04N 5/2257
See application file for complete search history.

(56) References Cited

U.S. PATENT DOCUMENTS

| | | |
|---|---|---|
| 2016/0150133 A1 | 5/2016 | Suzuki et al. |
| 2017/0353640 A1 | 12/2017 | Wang et al. |

FOREIGN PATENT DOCUMENTS

| | | | |
|---|---|---|---|
| CN | 205961279 U | * | 2/2017 |
| CN | 206742240 | | 12/2017 |
| CN | 206742240 U | * | 12/2017 |
| CN | 107910345 | | 4/2018 |
| CN | 207765447 | | 8/2018 |
| EP | 3 481 046 | | 5/2019 |
| JP | 2012-217021 | | 11/2012 |
| JP | 2016-100573 | | 5/2016 |
| KR | 10-2012-0112070 | | 11/2012 |
| WO | 2008/084646 | | 7/2008 |
| WO | 2017/186120 | | 11/2017 |

* cited by examiner

PHOTOSENSITIVE ASSEMBLY, PHOTOGRAPHING MODULE, AND PHOTOSENSITIVE ASSEMBLY JOINTED BOARD AND CORRESPONDING MANUFACTURING METHOD THEREOF

CROSS-REFERENCE OF RELATED APPLICATIONS

This application requires the priority and benefits of Chinese patent applications No. 201711378319.8 and 201721782486.4 filed with the National Intellectual Property Administration, PRC (CNIPA) on Dec. 19, 2017, the entire contents of these applications are incorporated herein by reference.

FIELD OF THE INVENTION

The present application relates to technical field of camera modules.

BACKGROUND OF THE INVENTION

At present, camera module industry is becoming more and more miniaturized, so as to meet requirements of integration and miniaturization of smart terminals. The biggest obstacle to the miniaturization of the camera modules is printed circuit board (also known as circuit board), because in order to ensure strength of the printed circuit board to prevent its deformation, thickness of the printed circuit board has a limit that is difficult to break through, which results in an axial dimension of the camera module or photosensitive assembly (refers to a dimension along an optical axis) is difficult to be reduced further.

On the other hand, in recent years, bezel-less screen mobile phones have become a foreseeable development trend of mobile phones. bezel-less screen mobile phones generally refer to mobile phones with a front screen ratio of more than 80%. Compared with ordinary mobile phones, mobile phones with extreme ultra-narrow bezel screens have obvious appearance advantages, it can bring a more shocking visual experience to mobile phone users, and it is foreseeable that many mobile phone manufacturers are willing to adopt a bezel-less screen solution. With the rise of the bezel-less screen trend, a front camera module of the mobile phone must inevitably be placed on the mobile phone very close to the bezel (such as top or bottom side bezel). This imposes higher requirements on a radial dimension of the camera module (referring to a dimension perpendicular to the optical axis).

To this end, the applicant proposed a MOC solution. In this solution, by molding and packaging a non-photosensitive area of photosensitive chip and other areas of printed circuit board into one, the printed circuit board can be thinner and lighter, and arrangement of electronic elements in the camera module can also be denser, thus satisfying current demand for miniaturization in the industry. In the MOC solution, a molding portion is formed on the circuit board by a molding process, and the molding portion covers edge portion of the photosensitive chip (that is, covers at least a part of the non-photosensitive area of the photosensitive chip) and gold wire electrically connecting the photosensitive chip and the circuit board. This solution can effectively reduce the radial dimension (referring to the dimension perpendicular to the optical axis) and the axial dimension (referring to the dimension along the optical axis) of the photosensitive assembly, thereby facilitate to reduce the size of the camera module, which is generally welcomed by the market.

However, there still needs some improvements in the manufacturing process of the MOC camera module. For example, in the MOC solution, the molding needs to encapsulate the non-photosensitive area of the photosensitive chip and the peripheral area of the chip as a whole, that is, the gold wire of the camera module (the gold wire connecting the photosensitive chip and the circuit board) also needs to be covered by the molding portion, and the usual molding solution is to inject liquefied EMC material into the die. This leads to a phenomenon that the mold flow breaks the gold wire when the EMC material is injected, resulting in defective products. Due to characteristics of the molding process itself, such defective products cannot be repaired, which makes such defective products only scrapped completely, which increases the difficulty of manufacturing the product of the camera module.

SUMMARY OF THE INVENTION

The present application aims to provide a solution that can overcome at least one of the above-mentioned drawbacks of the prior art.

According to an aspect of the present application, there is provided a photosensitive assembly, including:
a circuit board;
a photosensitive element mounted on the circuit board and having a first edge;
a first metal wire electrically connecting the photosensitive element and the circuit board, and the first metal wire spanning the first edge;
a first electronic element mounted on the circuit board, and a mounting area of the first electronic element being corresponding to an extension line of the first edge; and
a molding portion formed on the circuit board and surrounding the photosensitive element, and the molding portion extending toward the photosensitive element, covering the first electronic element and the first metal wire, and contacting a surface of the photosensitive element.

Wherein the photosensitive element has a plurality of first terminals provided along the first edge, and the circuit board has a plurality of second terminals, and the second terminals are provided on the circuit board along the first edge, and the second terminals correspond to the first terminals in one-to-one correspondence; and the first metal wire connects each of the first terminal and each of the second terminal corresponding thereto.

Wherein the photosensitive element further has a second edge opposite to the first edge; the photosensitive assembly further including:
a second metal wire electrically connecting the photosensitive element and the circuit board, and the second metal wire spanning the second edge; and
a second electronic element mounted on the circuit board, and a mounting area of the second electronic element being corresponding to an extension line of the second edge;
wherein, the molding portion also covers the second electronic element and the second metal wire.

Wherein the photosensitive element further has a third side crossing the first edge; and the photosensitive assembly further comprises a third metal wire electrically connecting the photosensitive element and the circuit board, and the third metal wire spans the third edge.

Wherein a dimension of the first electronic element in a direction perpendicular to the first edge is adapted to a dimension of a projection of the first metal wire on a surface of the circuit board in the direction perpendicular to the first edge.

Wherein a connection line between each of the first terminals and each of the second terminals corresponding thereto is not perpendicular to the first edge.

According to another aspect of the present application, there also provides a photosensitive assembly jointed panel, including:

a circuit board jointed panel including a plurality of circuit board units;

a plurality of photosensitive elements mounted in a row along a first direction on the circuit board jointed panel, each of the photosensitive elements being located on one circuit board unit, and each of the photosensitive elements having a first edge parallel to the first direction;

a plurality of first metal wires electrically connecting each of the photosensitive elements and the circuit board unit corresponding to the photosensitive element, and the first metal wire spanning the first edge of the photosensitive element;

a plurality of first electronic elements respectively mounted on each of the circuit board units and a mounting area of each of the first electronic elements being corresponding to an extension line of the first edge of the corresponding photosensitive element; and a molding portion formed on the circuit board jointed panel and surrounding each of the photosensitive elements, and the molding portion extending toward each of the photosensitive elements, covering the corresponding first electronic element and the first metal wire, and contacting a surface of the photosensitive element; and circuit board jointed panel areas between adjacent photosensitive elements are covered by the molding portion to form the molding portion as a whole.

Wherein each of the photosensitive elements has a plurality of first terminals provided along the first edge, and the circuit board unit corresponding to the photosensitive element has a plurality of second terminals, and the second terminals are provided on the circuit board unit along the first edge and correspond to the first terminals in one-to-one correspondence; the first metal wire connects each of the first terminals and each of the second terminals corresponding thereto.

Wherein each of the photosensitive elements further has a second edge opposite to the first edge; the photosensitive assembly jointed panel further comprises:

a plurality of second metal wires electrically connecting each of the photosensitive elements and the circuit board unit corresponding thereto, and the second metal wire spanning the second edge; and a plurality of second electronic elements mounted on each of the circuit board units and a mounting area of each of the second electronic elements being corresponding to an extension line of the second edge of the corresponding photosensitive element;

wherein, the molding portion also covers the second electronic element and the second metal wire.

Wherein each of the photosensitive elements further has a third side crossing the first edge; and the photosensitive assembly jointed panel further comprises a plurality of third metal wires electrically connecting each of the photosensitive elements and the circuit board unit corresponding thereto, and the third metal wire spans the third edge.

Wherein the circuit board jointed panel is a soft-hard combination board.

Wherein the circuit board jointed panel comprises at least one hard board area, and the plurality of photosensitive elements are mounted on the hard board area.

Wherein each of the hard board areas comprises two rows of circuit board units, and each of the circuit board units is mounted with one of the photosensitive elements.

Wherein the hard board area further comprises a non-wiring area between the two rows of circuit board units.

Wherein for each row of circuit board units, any two adjacent circuit board units have a common boundary.

Wherein, the photosensitive assembly is obtained by cutting the aforementioned photosensitive assembly jointed panel.

Wherein, the photosensitive assembly is obtained by cutting the aforementioned photosensitive assembly jointed panel with non-wiring area of the circuit board panel, wherein the non-wiring area is cut off.

According to another aspect of the present application, there also provides a camera module, including the aforementioned photosensitive assembly.

According to another aspect of the present application, there also provides a method for manufacturing a photosensitive assembly jointed panel, including:

step 1: preparing a to-be-molded jointed panel, the to-be-molded jointed panel includes:
- a circuit board panel comprising a plurality of circuit board units;
- a plurality of photosensitive elements mounted in a row on the circuit board panel, each of the photosensitive elements being located on one of the circuit board units, and each of the photosensitive elements having a first edge, and the first edge being parallel to an arrangement direction of the photosensitive elements in a same row;
- a plurality of first metal wires electrically connecting each of the photosensitive elements and the circuit board unit corresponding to the photosensitive element, and the first metal wire spanning the first edge of the photosensitive element; and
- a plurality of first electronic elements respectively mounted on each of the circuit board units to block or slow down an impact of mold flow to the first metal wire during a molding process;

step 2: pressing the to-be-molded jointed panel by a die to form a molding cavity between the die and the to-be-molded jointed panel; and step 3: injecting liquid molding material into the molding cavity to fill the molding cavity with the liquid molding material, and then forming a molding portion on the circuit board jointed panel;

wherein, an injection direction of the injected liquid molding material is parallel to the first edge.

Wherein in the step 1, a mounting area of the first electronic element is located on an extension line of the first edge of the corresponding photosensitive element to block or slow down the impact of the mold flow to the first metal wire during the molding process.

Wherein in the step 2, the molding cavity comprises a plurality of molding cavity units, and each of the molding cavity units corresponds to one of the circuits board units, and the plurality of molding cavity units communicate with each other.

Wherein in the step 3, the molding portion surrounds each of the photosensitive elements, and the molding portion extends toward each of the photosensitive element, covers the corresponding first electronic element and first metal wire, and contacts a surface of the photosensitive element; and circuit board jointed panel areas between adjacent photosensitive elements are covered by the molding portion to form the molding portion as a whole.

Wherein in the step 1, the circuit board panel is a soft-hard combination board, and the soft-hard combination board comprises at least one hard board area, and the plurality of photosensitive elements are mounted on the hard board area.

Wherein in the step 1, each of the hard board areas comprises two rows of circuit board units, each of the circuit board units is mounted with one of the photosensitive elements, the hard board area further comprises a non-wiring area between the two rows of circuit board units; and in the step 3, the liquid molding material is injected from a position of the non-wiring area.

Wherein in the step 1, each of the hard board areas comprises a first row of circuit board units and a second row of circuit board units, each of the circuit board units is mounted with one of the photosensitive elements; and in the step 3, injection positions of the liquid molding material comprise an area between the first row of circuit board units and the second row of circuit board units, and an area between the first row of photosensitive elements and the first edge of the hard board area, and an area between the second row of photosensitive elements and the second edge of the hard board area, wherein the first edge of the hard board area is an edge of the hard board area close to the first row of photosensitive elements and parallel to the first edge, and the second edge of the hard board area is an edge of the hard board area close to the second row of photosensitive elements and parallel to the first edge.

Wherein in the step 1, each of the hard board areas is composed of a single row of circuit board units, and each of the circuit board units is mounted with one of the photosensitive elements; and in the step 3, injections position of the liquid molding material comprise an area between the photosensitive element and the first edge of the hard board area, and an area between the photosensitive element and the second edge of the hard board area, wherein the first edge of the hard board area and the second edge of the hard board area are two edges of hard board areas parallel to the first edge, and the photosensitive element is located between the two edges of the hard board areas.

Wherein in the step 1, each of the photosensitive elements further has a second edge opposite to the first edge;
the to-be-molded jointed panel further comprises:
a plurality of second metal wires electrically connecting each of the photosensitive elements and the circuit board unit corresponding thereto, and the second metal wire spanning the second edge; and
a plurality of second electronic elements mounted on each of the circuit board units, and a mounting area of each of the second electronic elements is located on an extension line of the second edge of the corresponding photosensitive element;
wherein, the molding portion also covers the second electronic element and the second metal wire.

Wherein in the step 1, a dimension of the first electronic element in a direction perpendicular to the first edge is adapted to a dimension of a projection of the first metal wire on a surface of the circuit board in the direction perpendicular to the first edge.

Wherein in the step 1, a connection line between each of the first terminal and the second terminal corresponding thereto is not perpendicular to the first edge.

According to another embodiment of the present application, there also provides a photosensitive assembly jointed panel, being manufactured by the aforementioned method for manufacturing a photosensitive assembly jointed panel.

According to another embodiment of the present application, there also provides a photosensitive assembly, the photosensitive assembly is obtained by cutting the aforementioned photosensitive assembly jointed panel.

According to another embodiment of the present application, there also provides a photosensitive assembly, the photosensitive assembly is obtained by cutting a photosensitive assembly jointed panel, wherein the photosensitive assembly jointed panel is obtained by the aforementioned method for manufacturing a photosensitive assembly jointed panel, and at the time of cutting the photosensitive assembly jointed panel, the non-wiring area is cut off.

According to another embodiment of the present application, there also provides a camera module, including the aforementioned photosensitive assembly.

Compared with the prior art, the present application has at least one of the following technical effects:

1. The present application can reduce the risk of damage of the gold wire in the molding process to a certain extent without adding extra parts and changing the die.

2. The present application increases the production yield and reduces the production cost.

BRIEF DESCRIPTION OF THE DRAWINGS

Exemplary embodiments are shown in the reference drawings. The embodiments and drawings disclosed herein should be regarded as illustrative rather than restrictive.

DETAIL DESCRIPTION OF THE INVENTION

In order to better understand the present application, various aspects of the present application will be described in more detail with reference to the drawings. It should be understood that these detailed descriptions are merely descriptions of exemplary embodiments of the present application, and do not limit the scope of the present application in any way. Throughout the specification, the same reference numerals refer to the same elements. The expression "and/or" includes any and all combinations of one or more of the associated listed items.

It should be noted that in this specification, the expressions of first, second, etc. are only used to distinguish one feature from another feature, and do not represent any limitation on the feature. Therefore, without departing from the teachings of the present application, the first body discussed below may also be referred to as the second body.

In the drawings, the thickness, dimension and shape of objects have been slightly exaggerated for ease of explanation. The drawings are only examples and are not strictly drawn to scale.

It should also be understood that the terms "include", "including", "having", "comprise" and/or "comprising", when used in this specification, indicate the existence of stated features, wholes, steps, operations, elements and/or components, but does not exclude the presence or addition of one or more other features, wholes, steps, operations, elements, components and/or combinations thereof. In addition, when an expression such as "at least one of" appears after the list of listed features, the entire listed feature is modified, rather than modifying individual elements in the list. In addition, when describing embodiments of the present application, the use of "may" means "one or more embodiments of the present application." Also, the term "exemplary" is intended to refer to an example or illustration.

As used herein, the terms "substantially", "approximately", and similar terms are used as an approximation term, not as a degree term, and are intended to illustrate the inherent deviations in measured or calculated values that will be recognized by those skilled in the art.

Unless otherwise defined, all terms (including technical and scientific terms) used herein have the same meaning as commonly understood by those skilled in the art to which this application belongs.

It should also be understood that terms (such as those defined in commonly used dictionaries) should be interpreted as having meanings consistent with their meaning in the context of the relevant technology, and will not be interpreted in an idealized or excessively formal sense unless it is clearly defined herein.

It should be noted that the embodiments and the features in the embodiments in the present application can be combined with each other without conflict. The present application will be described in detail below with reference to the drawings and in conjunction with the embodiments.

Figure 1:
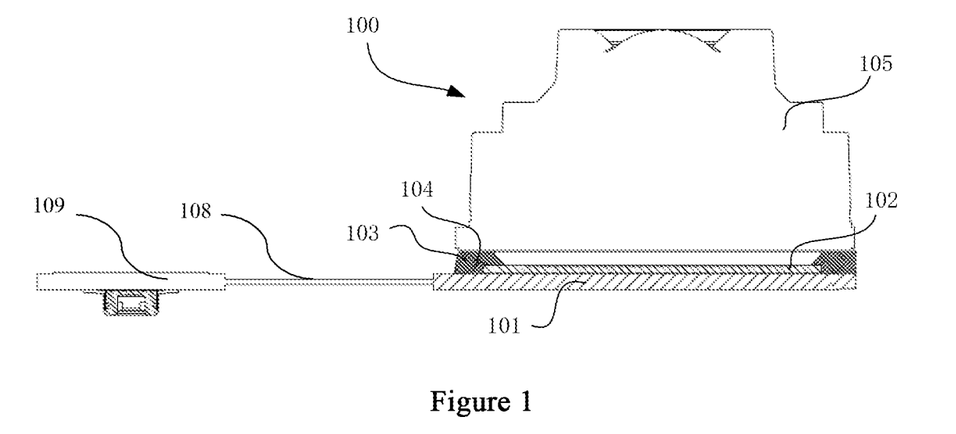
FIG. 1 shows a schematic cross-sectional view of a camera module provided by an embodiment of the present application.

FIG. 1 shows a schematic cross-sectional view of a camera module provided by an embodiment of the present application. The camera module is manufactured based on a process of molding on chip (MOC process). Referring to FIG. 1, the camera module 100 includes a circuit board 101, a photosensitive element 102, a molding portion 103, a metal wire 104 and a lens assembly 105. Among them, the circuit board 101 has a first surface and an opposite second surface, and the photosensitive element 102 is mounted on the first surface of the circuit board 101. The second surface serves as a bottom surface of the circuit board 101 (herein, the bottom surface of the circuit board refers to the second surface). The molding portion 103 is formed on the circuit board 101 and surrounds the photosensitive element 102, and the molding portion 103 extends toward and contacts the photosensitive element 102, so that there is no gap between the molding portion 103 and a side surface of photosensitive element 102. The metal wire 104 is used to electrically connect the photosensitive element 102 and the circuit board 101. The lens assembly 105 is mounted on the molding portion 103, thereby constituting a complete camera module. The lens assembly 105 includes a lens. In some embodiments, the lens assembly 105 may further include a motor, the lens is mounted on a carrier of the motor, and a motor base is mounted on the molding portion 103.

The camera module 100 is generally divided into two parts: the photosensitive assembly and the lens assembly 105, wherein the photosensitive assembly includes the circuit board 101, the photosensitive element 102, the molding portion 103 and the metal wire 104. At the time of manufacturing the camera module 100, the photosensitive assembly is first manufactured, and then the lens assembly 105 is mounted on the photosensitive assembly.

Figure 2:
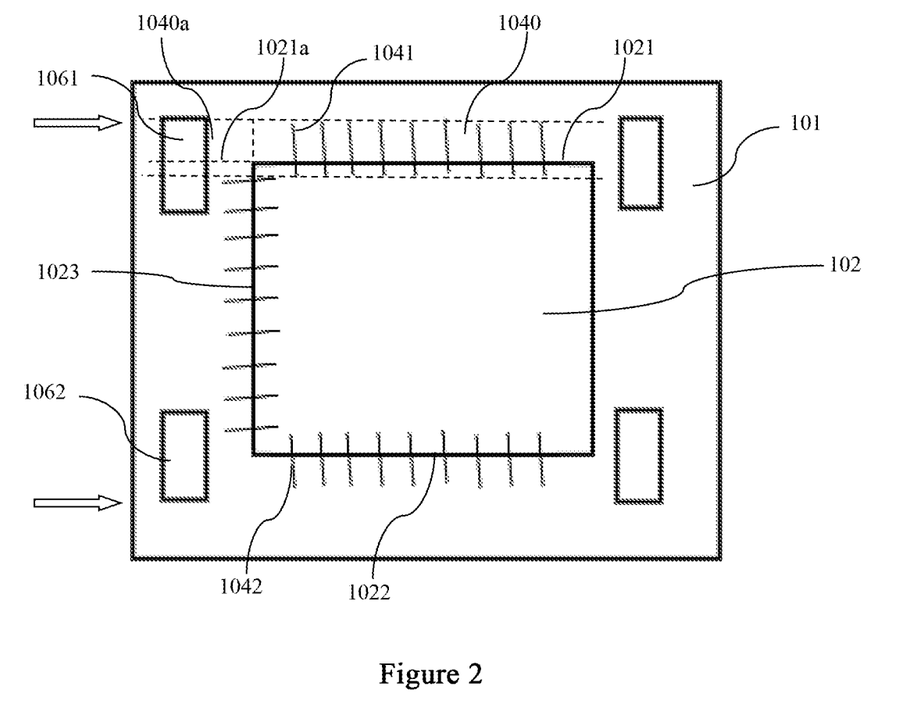
FIG. 2 shows a schematic top view of the photosensitive assembly in the embodiment of FIG. 1.

FIG. 2 shows a schematic top view of the photosensitive assembly in the embodiment of FIG. 1, and the molding portion is not shown in this figure to more clearly show positional relationship of the photosensitive element, the metal wire, and the electronic element. The photosensitive assembly also includes electronic elements mounted on the circuit board 101. As shown in FIG. 2, the photosensitive element 102 has a rectangular shape, and has a first edge 1021, a second edge 1022 opposite to the first edge 1021, and a third side 1023 crossing the first edge 1021. The metal wire includes a first metal wire 1041 that spans the first edge 1021. There may be a polarity of first metal wires 1041, which are arranged along the first edge 1021.

The electronic element includes a first electronic element 1061. The first electronic element 1061 is mounted on the circuit board 101 and a mounting area of the first electronic element 1061 corresponds to an extension line 1021a of the first edge 1021. The extension line 1021a corresponding to the first edge 1021 may be located on the extension line 1021a of the first edge 1021 or may be located near the extension line 1021a of the first edge 1021. In this embodiment, the molding portion 103 covers the first electronic element 1061 and the first metal wire 1041 and contacts a surface of the photosensitive element 102. In this embodiment, the first electronic element 1061 is intentionally arranged on a side of the gold wire perpendicular (or substantially perpendicular) to a mold flow direction, so that when the molding process is performed, the electronic element can have a certain blocking effect on the mold flow, so that the mold flow will not have a direct impact on the gold wire, so as to protect the gold wire to a certain extent. The wiring board 101 may be a printed wiring board. In this embodiment, by setting the mounting area of the first electronic element 1061 at a position corresponding to the extension line 1021a of the first edge 1021, the direct impact of the liquid mold flow to the first metal wire 1041 during the molding process is blocked or at least partially blocked. In one embodiment, when the mounting area of the first electronic element 1061 is not located on the extension line 1021a of the first edge 1021, as long as the first electronic element 1061 can partially block the direct impact of the liquid mold flow to the first metal wire 1041 during the molding process, it can be regarded as the first electronic element 1061 being mounted on the position near the extension line 1021a of the first edge 1021.

In one embodiment, the metal wire may be a gold wire. In actual production, two ends of the metal wire can be welded to solder joints of the photosensitive element 102 and the circuit board 101 through the "wire bonding" process, so that the photosensitive element 102 and the circuit board 101 are electrically connected, to facilitate the image data received by the photosensitive element 102 to be output. The solder joints of the circuit board 101 are the terminals of the circuit board 101. In one embodiment, the photosensitive element 102 has a plurality of first terminals provided along the first edge 1021, the circuit board 101 has a plurality of second terminals, and the second terminals are provided on the circuit board 101 along the first edge 1021 and the second terminal corresponds to the first terminal in one-to-one correspondence; the metal wire connects the first terminal and the second terminal corresponding thereto.

Figure 3:
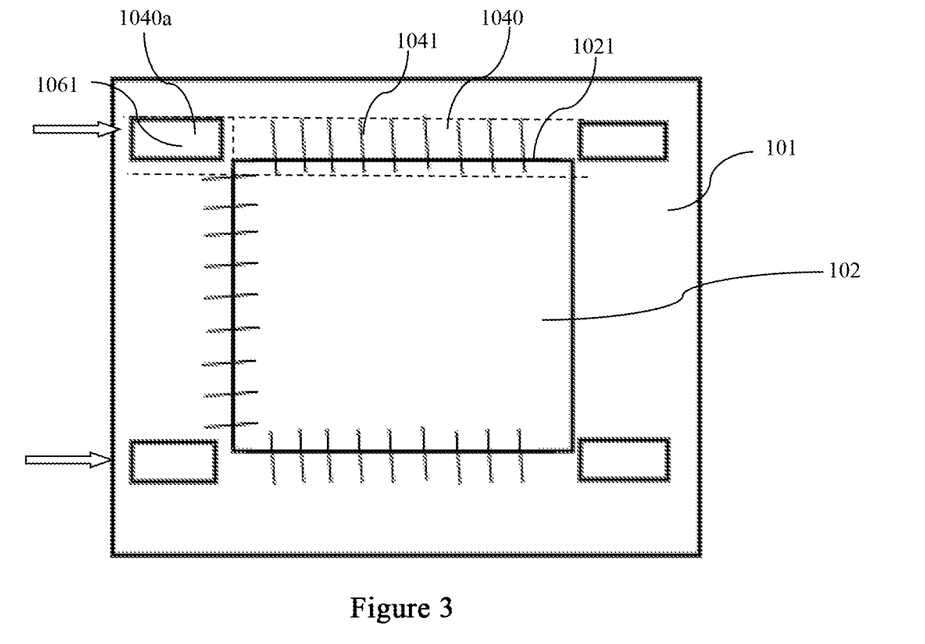
FIG. 3 shows a schematic top view of a photosensitive assembly in another embodiment of the present application.

In one embodiment, a dimension of the first electronic element 1061 in a direction perpendicular to the first edge 1021 is adapted to a dimension of a projection of the first metal wire 1041 on the surface of the circuit board 101 in a direction perpendicular to the first edge 1021 (since FIG. 2 is a top view, the first metal wire 1041 shown in the figure is actually consistent with the projection of the first metal wire 1041 on the surface of the circuit board 101). When the projection of the first electronic element 1061 on the surface of the circuit board 101 (because FIG. 2 is a top view, the projection is actually consistent with a shape of the first electronic element 1061 in FIG. 2) is rectangular, a length direction of the first electronic element 1061 is made to be perpendicular to the first edge 1021 (as shown in FIG. 2), so as to prevent the mold flow from directly impacting the first metal wire 1041 across the first edge 1021. The mold flow here refers to the mold flow formed by the liquid molding material during molding of the molding portion 103. Certainly, in other embodiments, a width direction of the first electronic element 1061 may be made to be perpendicular to the first edge 1021 (as shown in FIG. 3, which shows a schematic top view of the photosensitive assembly in another embodiment of the present application, in this figure, the molding portion is not shown in order to more clearly show the positional relationship of the photosensitive element, the metal wire, and the electronic element). In this way, block of the first electronic element 1061 against the mold flow is relatively small, which is beneficial for filling the molding cavity with the molding material. The above embodiment can reduce the risk of damage of the gold wire in the molding process to a certain extent without adding extra components and changing the die; and can increase the production yield and reduce the production cost.

Referring to FIG. 2, in one embodiment, the plurality of first terminals and the plurality of second terminals arranged along the first edge 1021 define a strip-shaped metal wire arrangement area 1040. The strip-shaped metal wire arrangement area 1040 covers the first edge 1041. The mounting area of the first electronic element 1061 is located in an extension portion 1040*a* of the strip-shaped metal wire arrangement area 1040. In the present application, the first electronic element 1061 may completely cover the extension portion 1040*a* of the metal wire arrangement region 1040 in a direction perpendicular to the first edge (as shown in FIG. 2), or partially covers the extension portion 1040*a* of the metal wire arrangement area 1040 in a direction perpendicular to the first edge (as shown in FIG. 3). In other words, as long as the first electronic element 1061 at least partially covers the extension portion 1040*a* of the metal wire arrangement area 1040 in a direction perpendicular to the first edge, it can be regarded that the mounting area of the first electronic element 1061 corresponds to the extension line 1021*a* of the first edge 1021.

Figure 4:
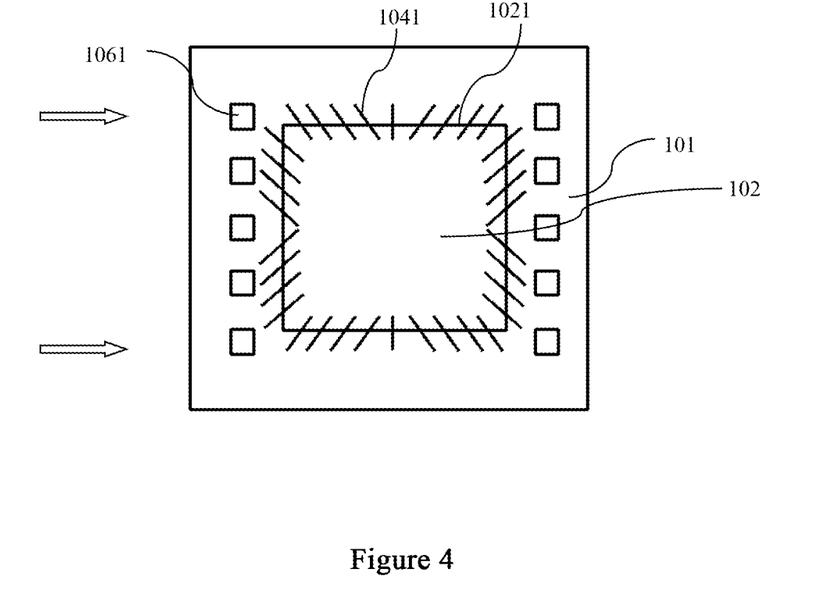
FIG. 4 shows a schematic top view of a photosensitive assembly in still another embodiment of the present application.

Further, FIG. 4 shows a schematic top view of a photosensitive assembly according to yet another embodiment of the present application. The molding section is not shown in this figure to more clearly show the positional relationship of the photosensitive element, the metal wire, and the electronic element. In the embodiment of FIG. 4, the connection line between the first terminal and the corresponding second terminal is not perpendicular to the first edge 1021. In this way, the projection of the first metal wire 1041 on the surface of the circuit board 101 is not perpendicular to the first edge 1021. This inclined "wire-bonding" design helps to reduce the impact of the mold flow to the first metal wire 1041. Due to the limitation of the "wire bonding" process, the length of the first metal wire 1041 is difficult to shrink indefinitely. If an inclined "wire-bonding" manner is adopted (that is, the projection of the first metal wire 1041 on the surface of the circuit board 101 is not perpendicular to the first edge 1021), then it helps to reduce a stress surface of the first metal wire 1041 subjected to the mold flow impact (because the inclined "wire-bonding" can reduce a dimension of the projection of the first metal wire 1041 on the surface of the circuit board 101 in the direction perpendicular to the first edge 1021). In this way, the dimension of the first electronic element 1061 in the direction perpendicular to the first edge 1021 can also be reduced, for example, when the projection of the first electronic element 1061 on the surface of the circuit board 101 is rectangular, the width direction of the first electronic element 1061 is made to be perpendicular to the first edge 1021. In this way, on the one hand, the first electronic element 1061 blocks the mold flow relatively small, which is beneficial for filling the molding cavity with the molding material. On the other hand, due to the inclined "wire bonding" manner, the force-bearing surface of the first metal wire 1041 subjected to the mold flow impact is reduced, so as long as the width of the first electronic element 1061 is adapted to a dimension of the projection of the reduced first metal line 1041 on the surface of the circuit board 101 in the direction perpendicular to the first edge 1021, it can effectively block the direct impact of the mold flow to the first metal wire 1041.

Still referring to FIG. 2, in one embodiment, the photosensitive assembly further includes: a second metal wire 1042 and a second electronic element 1062. The second metal wire 1042 electrically connects the photosensitive element 102 and the circuit board 101, and the second metal wire 1042 spans the second edge 1022. The second electronic element 1062 is mounted on the circuit board 101 and the mounting area of the second electronic element 1062 is located on the extension line of the second edge 1022. The molding portion also covers the second electronic element 1062 and the second metal wire 1042. Similar to the first metal wire 1041, the second metal wire 1042 spanning the second edge 1022 is also susceptible to the impact of mold flow. Therefore, the second electronic element 1062 is mounted at a position corresponding to the extension line of the second edge 1022, so as to block the direct impact of the mold flow to the second metal wire 1042. The "wire bonding" process of the second metal wire 1042 may be consistent with the "wire bonding" method of the first metal wire 1041 in the foregoing embodiment. For example, the second metal wire 1042 can also use the inclined "wire bonding" manner (that is, the projection of the second metal wire 1042 on the surface of the circuit board 101 is not perpendicular to the second edge 1022).

Still referring to FIG. 2, in one embodiment, the photosensitive element 102 has a third side crossing the first edge 1021. And the photosensitive assembly further includes a third metal wire. The third metal wire electrically connects the photosensitive element 102 and the circuit board 101, and the third metal wire crosses the third edge. In this embodiment, the projection of the third metal wire on the surface of the circuit board 101 is parallel or substantially parallel to the first edge 1021, so that the third metal wire is less impacted by the mold flow. Of course, in other embodiments, the third metal wire may also use the inclined "wire bonding" manner.

Figure 5:
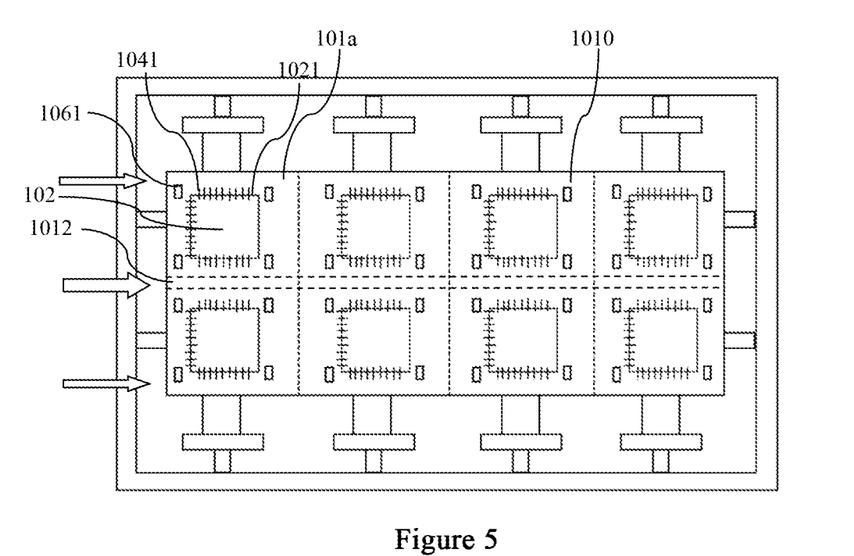
FIG. 5 shows a schematic top view of a photosensitive assembly jointed panel in an embodiment of the present application.

Further, FIG. 5 shows a schematic top view of a photosensitive assembly jointed panel in an embodiment of the present application. The molding portion is not shown in this figure to more clearly show the positional relationship of the photosensitive element, the metal wire, and the electronic element. Referring to FIG. 5, the photosensitive assembly jointed panel includes a circuit board jointed panel, a plurality of photosensitive elements 102, a plurality of first metal wires 1041, a plurality of first electronic elements 1061, and a molding portion (the molding portion is not shown in FIG. 5). The circuit board jointed panel includes a plurality of circuit board units 101a. The plurality of photosensitive elements 102 are mounted in a row along a first direction (a direction indicated by the arrow in FIG. 5) on the circuit board jointed panel, each of the photosensitive elements 102 is located on a circuit board unit 101a, and each of the photosensitive elements 102 have a first edge 1021 parallel to the first direction. The plurality of first metal wires 1041 electrically connect each of the photosensitive elements 102 and the circuit board unit 101a corresponding to the photosensitive element 102, and the first metal wire 1041 spans the first edge 1021 of the photosensitive element 102. The plurality of first electronic elements 1061 are respectively mounted on each of the circuit board units 101a and mounting areas of the first electronic elements 1061 are located on an extension line of the first edge 1021 of the corresponding photosensitive element 102. The molding portion is formed on the circuit board jointed panel and surrounds each of the photosensitive elements 102, and the molding portion extends toward each of the photosensitive elements 102, covers the corresponding first electronic elements 1061 and the first metal wire 1041, and contacts with a surface of the photosensitive element 102; and a circuit board jointed panel area between adjacent photosensitive elements 102 is covered by the molding portion to form the molding portion as a whole.

In one embodiment, each of the photosensitive elements 102 has a plurality of first terminals provided along the first edge 1021, and the circuit board unit 101a corresponding to the photosensitive element 102 has a plurality of second terminals, the second terminals are provided on the circuit board unit 101a along the first edge 1021 and correspond to the first terminals in one-to-one correspondence; the metal wire connects the first terminal and the second terminal corresponding thereto.

In one embodiment, each of the photosensitive elements 102 further has a second edge 1022 opposite to the first edge 1021. The photosensitive assembly jointed panel further includes: a plurality of second metal wires 1042 and a plurality of second electronic elements 1062. A plurality of second metal wires 1042 electrically connect each of the photosensitive elements 102 and the circuit board unit 101a corresponding thereto, and the second metal wire 1042 spans the second edge 1022. The plurality of second electronic elements 1062 are mounted on each of the circuit board units 101a and mounting areas of the second electronic elements 1062 are located on an extension line of the second edge 1022 of the corresponding photosensitive element 102. The molding portion covers the first electronic element 1061, the first metal wire 1041, the second electronic element 1062, and the second metal wire 1042.

Further, in one embodiment, each of the photosensitive elements 102 further has a third side crossing the first edge 1021; and the photosensitive assembly jointed panel further includes a plurality of third metal wires that electrically connects the photosensitive element 102 and the circuit board unit 101a corresponding thereto, and the third metal wire spans the third edge. In one embodiment, for the rectangular photosensitive element 102, it may have two first edges 1021 parallel to each other, and two third edges parallel to each other (the third edge crosses the first edge 1021). The photosensitive assembly may have a plurality of first metal wires 1041 corresponding to two first edges 1021 and a plurality of first electronic elements 1061. The photosensitive element may also have only the first metal wire 1041 spanning one of the first edges 1021 and the corresponding first electronic element 1061. When the circuit design of the photosensitive assembly requires more electronic elements to be placed on the circuit board, these electronic elements can be arranged on an area of the circuit board unit 101a between the third edge of the photosensitive element 102 and the boundary of the corresponding circuit board unit 101a (The boundary of the circuit board unit 101a is substantially parallel to the third edge).

In one embodiment, the circuit board jointed panel is a soft-hard combination board. The circuit board jointed panel includes at least one hard board area 1010 (referring to FIG. 5), and the plurality of photosensitive elements 102 are mounted on the hard board area 1010. Each of the hard board areas includes two rows of circuit board units 101a, and each of the circuit board units 101a is mounted with one of the photosensitive element 102. It should be noted that in other embodiments, each of the hard board areas may also be provided with only one row of circuit board units 101a.

In one embodiment, the hard board area 1010 further includes a non-wiring area 1012 between two rows of circuit board units 101a (referring to FIG. 5). The photosensitive assembly is obtained by cutting the aforementioned photosensitive assembly jointed panel with the non-wiring area of the circuit board jointed panel, and the non-wiring area 1012 is cut off, which can ensure that the photosensitive assembly has a smaller radial dimension (the radial dimension refers to the dimension perpendicular to the optical axis of the camera module). On the other hand, providing the non-wiring area 1012 between the two rows of circuit board units 101a helps to widen the main flow channel of the mold flow, so that the mold flow can more easily fill the entire molding cavity.

Further, referring to FIG. 5, in one embodiment, for each row of circuit board units 101a, any two adjacent circuit board units 101a have a common boundary, so as to reduce the number of times that the photosensitive assembly jointed panel is cut into photosensitive assemblies, and save molding materials and circuit board jointed panel materials at the same time.

Figure 6:
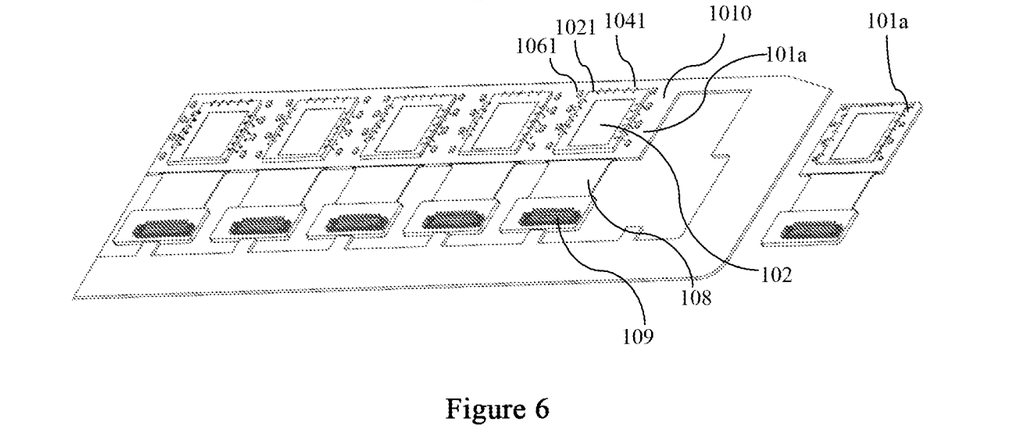
FIG. 6 shows a perspective schematic view of an embodiment of a to-be-molded jointed panel.

According to another embodiment of the present application, there also provides a method for manufacturing a photosensitive assembly jointed panel, including:

Step 1: preparing a to-be-molded jointed panel. FIG. 6 shows a schematic perspective view of an embodiment of a to-be-molded jointed panel. Referring to FIG. 6, the to-be-molded jointed panel includes: a circuit board jointed panel, a plurality of photosensitive elements 102, a plurality of first metal wires 1041, and a plurality of first electronic elements 1061.

Among them, the circuit board jointed panel includes at least one hard board area 1010, and the hard board area 1010 includes a plurality of circuit board units 101a. A plurality of photosensitive elements 102 are mounted in a row on the circuit board jointed panel 1010, each of the photosensitive elements 102 is located on a circuit board unit 101a, and each of the photosensitive elements 102 has a first edge 1021, the first edge 1021 is parallel to an arrangement direction of the photosensitive elements 102 in a single row. A plurality of first metal wires 1041 electrically connect each of the photosensitive element 102 and the circuit board unit 101a corresponding to the photosensitive element 102, and the first metal wire 1041 spans the first edge 1021 of the photosensitive element 102. A plurality of first electronic elements 1061 are respectively mounted on each of the circuit board units 101a to block or slow down the impact of the mold flow to the first metal wire 1041 during the molding process.

In one embodiment, a mounting area of the first electronic element 1061 is located on an extension line of the first edge 1021 of the corresponding photosensitive element 102 to block or slow down the impact of the mold flow to the first metal wire 1041 during the molding process.

In one embodiment, the circuit board jointed panel may be a soft-hard combination board, and the soft board area forms a connection band 108 and a connector 109. Herein, the connection band 108 is electrically connected to the hard board area 1010 through a side surface of the hard board area 1010 in order to reduce the dimension of the finished photosensitive assembly.

Figure 7:
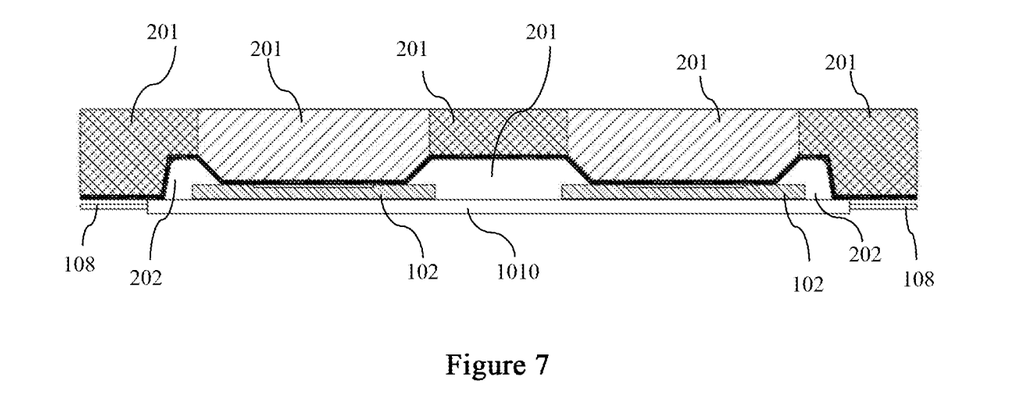
FIG. 7 shows a schematic cross-sectional view of a die after being pressed in an embodiment of the present application.

Step 2: pressing the to-be-molded jointed panel by a die to form a molding cavity between the die and the to-be-molded jointed panel. FIG. 7 shows a schematic cross-sectional view of a die after being pressed in an embodiment of the present application, the cross-section is a cross-section perpendicular to the first edge 1021. Only a single-row of circuit board unit is shown in FIG. 6, but it can be understood that each of the hard board areas 1010 can be provided with two rows of circuit board units (as shown in FIG. 5). The hard board area 1010 shown in FIG. 7 is provided with two rows of circuit board units, and the die 201 is pressed against the hard board area 1010 to form a molding cavity 202. The first edge 1021 and the second edge 1022 opposite thereto (for example, the second edge 1022 may be the opposite edge parallel to the first edge 1021) are in the molding cavity 202, and the metal wires spanning the first edge 1021 and the second edge 1022 are also in the molding cavity 202. The two photosensitive elements 102 are respectively mounted on the left and right sides of FIG. 7. The photosensitive elements 102 on the left and right sides in FIG. 7 respectively correspond to the photosensitive elements 102 in the upper and lower rows in FIG. 5. Further, the molding cavity 201 includes a plurality of molding cavity units, each of the molding cavity units corresponds to one of the circuit board units 101a, and the plurality of molding cavity units communicate with each other.

Step 3: injecting liquid molding material into the molding cavity to fill the molding cavity with the molding material, so as to form a molding portion on the circuit board jointed panel; herein, an injection direction of the injected liquid molding material (An arrow in FIG. 5 shows the injection direction) is parallel to the first edge 1021.

Figure 8:
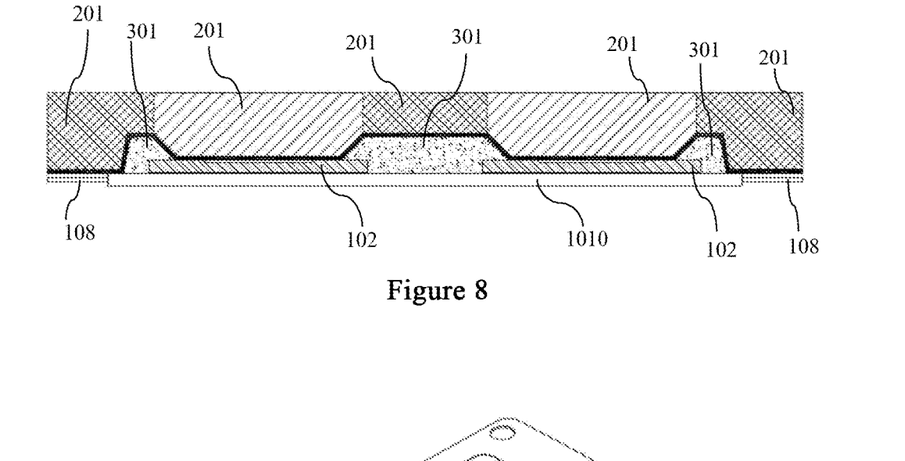
FIG. 8 shows a schematic cross-sectional view based on FIG. 7 after filling with liquid molding material.

FIG. 8 shows a schematic cross-sectional view based on FIG. 7 after filling with liquid molding material. In FIG. 8, 301 indicates the liquid molding material. Since the plurality of molding cavity units communicate with each other, the molding portion formed by molding surrounds each of the photosensitive elements 102, and the molding portion extends toward each of the photosensitive elements 102, covers the corresponding first electronic element 1061 and first metal wire, and contacts a surface of the photosensitive element 102; and a circuit board panel area between adjacent photosensitive elements 102 is covered by the molding portion to form the molding portion as a whole.

Figure 9:
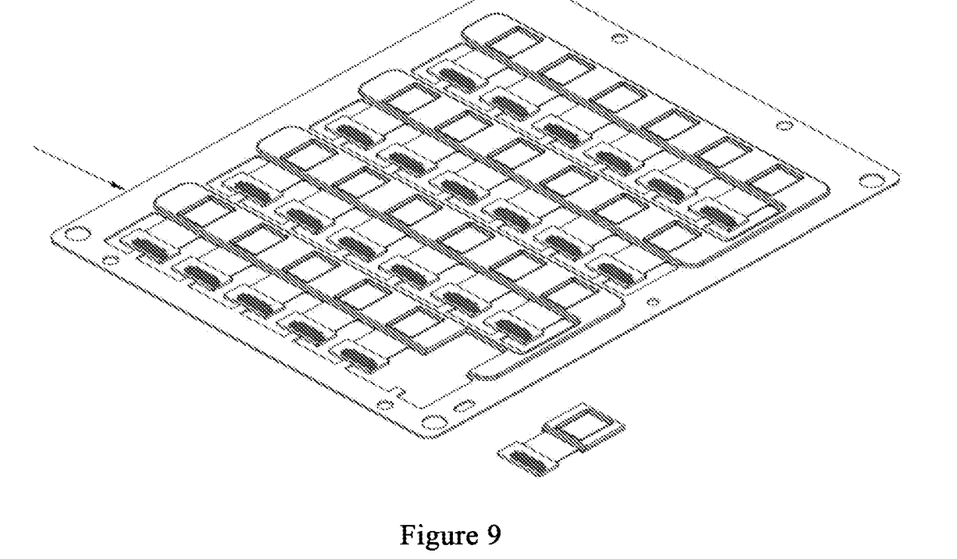
FIG. 9 is a three-dimensional schematic view of a photosensitive assembly jointed panel after molding is completed in an embodiment.

In one embodiment, in the step 1, the circuit board jointed panel is a soft-hard combination board, the soft-hard combination board includes at least one hard board area, and the plurality of photosensitive elements 102 are mounted on the hard board area. In one embodiment, only one row of circuit board units 101a may be provided for each of the hard board areas of the circuit board jointed panel, so that the molding material can easily fill the entire molding cavity. In this embodiment, injection positions of the liquid molding material include: an area between the photosensitive element and an upper edge of the hard board area, and an area between the photosensitive element and a lower edge of the hard board area. An injection direction of the liquid molding material is substantially parallel to the first edge 1021. In this embodiment, a single hard board area has two molding material flow channels, which makes easier for the molding flow to fill the entire molding cavity, and avoids the appearance defects of the molding portion of the jointed panel, thereby improving the yield. The arrow in FIG. 2 shows the injection direction and injection positions of the liquid molding material. FIG. 9 shows a schematic perspective view of the photosensitive assembly jointed panel after molding is completed in an embodiment. It can be seen that the photosensitive assembly jointed panel includes four hard board areas, and each of the hard board areas is provided with a single-row of circuit board unit (that is, a single-row photosensitive assembly is provided). The arrow in FIG. 9 shows the injection direction of the liquid molding material. It can be seen that the injection direction is substantially parallel to the first edge 1021. It should be noted that the complete jointed panel is not shown in FIG. 2. In this embodiment, the part shown in FIG. 2 can be understood as a circuit board unit in the circuit board jointed panel corresponding to FIG. 9.

In another embodiment, in the step 1, each of the hard board areas includes two rows of circuit board units 101a, each of the circuit board units 101a is mounted with one of the photosensitive elements, and the hard board area further includes a non-wiring area between the two rows of circuit board units 101a. Also, in the step 3, the liquid molding material is injected from a position of the non-wiring area (the arrow in FIG. 5 shows the injection position). In this way, the area between the two rows of photosensitive elements in the molding cavity can serve as a corresponding flow channel, in which liquid molding material flows from left to right and fills the entire molding cavity. In this embodiment, providing a non-wiring area between the two rows of circuit board units 101a helps to widen the main flow channel of the mold flow, thereby making easier for the mold flow to fill the entire molding cavity. Further, referring still to FIG. 5, in a preferred embodiment, the injection position of the liquid molding material includes an area between two rows of photosensitive elements, an area between the first row of photosensitive elements and the upper edge of the hard board area and the area between the second row of photosensitive elements and the lower edge of the hard board area. The first row of photosensitive elements is an upper row of photosensitive elements, and the second row of photosensitive elements is a lower row of photosensitive elements. The injection direction of the liquid molding material is substantially parallel to the first edge 1021, for example, from left to right in FIG. 5. In this embodiment, the molding material has three flow channels. Referring to FIGS. 7 and 8, the molding cavity 202 includes three parts, and these three parts respectively correspond to the three flow channels. Compared with a single flow channel, the three flow channels can make the mold flow easier to fill the entire molding cavity, and avoid the appearance defects of the molding portion of the panel, thereby improving the yield.

Figure 10:
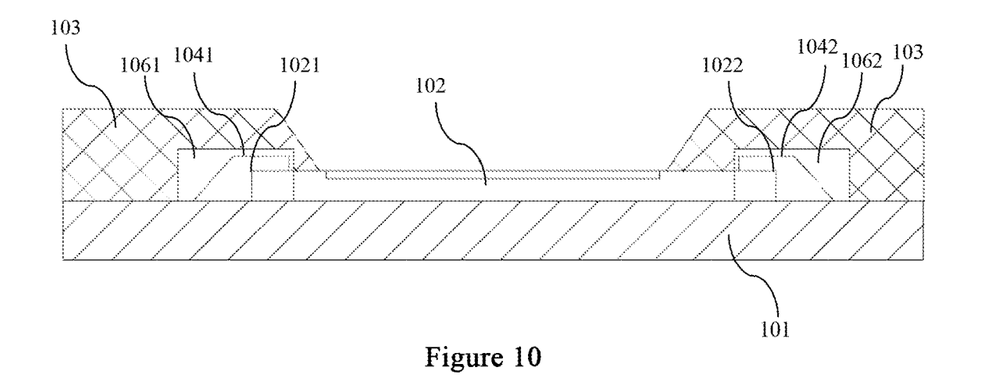
FIG. 10 shows positional relationship between electronic elements and metal wires in the photosensitive assembly of the present application.

Further, FIG. 10 shows positional relationship between the electronic elements and the metal wires in the photosensitive assembly of the present application. The viewing angle of FIG. 10 is same as that of FIG. 7 or 8, and a part sheltered by the electronic element is indicated by a dotted line. It can be seen that both the first edge 1021 and the first metal wire 1041 are sheltered by the first electronic element 1061, and the second edge 1022 and the second metal wire 1042 are sheltered by the second electronic element 1062. In this way, during the molding process, the first electronic element 1061 can block or slow down the impact of the mold flow in the flow channel to the first metal wire 1041, and the second electronic element 1062 can block or slow down the impact of the mold flow in the flow channel to the second metal wire 1042.

The above description is only the preferred embodiment of the present application and the explanation of the applied technical principles. Those skilled in the art should understand that the scope of the invention involved in present application is not limited to a technical solution formed by a specific combination of the above technical features, but it should also encompass other technical solutions formed by any combination of the above technical features or their equivalent features without departing from the inventive concept. For example, the above features and the technical features disclosed in present application (but not limited to) with similar functions can be replaced with each other to form a technical solution.

The invention claimed is:

1. A photosensitive assembly comprising:
   a circuit board;
   a photosensitive element mounted on the circuit board and having a first edge;
   a first metal wire electrically connecting the photosensitive element and the circuit board, the first metal wire spanning the first edge;
   a first electronic element mounted on the circuit board, the first electronic element having a mounting area that corresponds to an extension line of the first edge; and
   a molding portion formed on the circuit board and surrounding the photosensitive element, the molding portion extending toward the photosensitive element, covering the first electronic element and the first metal wire, and contacting a surface of the photosensitive element,
   wherein a dimension of the first electronic element in a direction perpendicular to the first edge is adapted to a dimension of a projection of the first metal wire on a surface of the circuit board in the direction perpendicular to the first edge.

2. The photosensitive assembly according to claim 1, wherein the photosensitive element has a plurality of first terminals provided along the first edge, and the circuit board has a plurality of second terminals, the second terminals being provided on the circuit board along the first edge, the second terminals corresponding to the first terminals in one-to-one correspondence, and the first metal wire connecting each of the first terminal and each of the second terminal corresponding thereto.

3. The photosensitive assembly according to claim 2, wherein a connection line between each of the first terminals and each of the second terminals corresponding thereto is not perpendicular to the first edge.

4. The photosensitive assembly according to claim 1, wherein the photosensitive element further has a second edge opposite to the first edge,
   wherein the photosensitive assembly further comprises:
   a second metal wire electrically connecting the photosensitive element and the circuit board, the and the second metal wire spanning the second edge; and
   a second electronic element mounted on the circuit board, the second electronic element having a mounting area that corresponds to an extension line of the second edge, and
   wherein the molding portion also covers the second electronic element and the second metal wire.

5. The photosensitive assembly according to claim 1, wherein the photosensitive element further has a third edge crossing the first edge, and
   wherein the photosensitive assembly further comprises a third metal wire electrically connecting the photosensitive element and the circuit board, the third metal wire spanning the third edge.

6. The photosensitive assembly according to claim 1, wherein the photosensitive assembly is obtained by cutting a photosensitive assembly jointed panel, the photosensitive assembly jointed panel comprising:
   a circuit board jointed panel including a plurality of the circuit board;
   a plurality of the photosensitive elements mounted in a row along a first direction on the circuit board jointed panel, each of the photosensitive elements being located on one circuit board, and each of the photosensitive elements having a first edge parallel to the first direction;
   a plurality of the first metal wires electrically connecting each of the photosensitive elements and the circuit board corresponding to the photosensitive element; and
   a plurality of the first electronic elements respectively mounted on each of the circuit boards a mounting area of each of the first electronic elements corresponding to an extension line of the first edge of the corresponding photosensitive element,
   wherein the molding portion isg formed on the circuit board jointed panel and surrounds each of the photosensitive elements, the molding portion extending toward each of the photosensitive elements, and covering the corresponding first electronic element and the first metal wire,
   wherein circuit board jointed panel areas between adjacent photosensitive elements are covered by the molding portion to form the molding portion as a whole, and
   wherein the circuit board jointed panel is a soft-hard combination board.

7. The photosensitive assembly according to claim 6, wherein the circuit board jointed panel comprises at least one hard board area, and the plurality of photosensitive elements are mounted on the hard board area.

8. The photosensitive assembly according to claim 7, wherein each of the at least one hard board area comprises two rows of circuit boards, and each of the circuit boards is mounted with one of the photosensitive elements.

9. The photosensitive assembly according to claim 8, wherein for each row of circuit boards, any two adjacent circuit boards have a common boundary.

10. The photosensitive assembly according to claim 8, wherein the at least one hard board area further comprises a non-wiring area between the two rows of circuit boards.

11. The photosensitive assembly according to claim 10, in a case where the photosensitive assembly is obtained by cutting the photosensitive assembly jointed panel, the non-wiring area is cut off.

12. A camera module comprising the photosensitive assembly according to claim 1.

13. A method for manufacturing a photosensitive assembly jointed panel, the method comprising:
   step 1: preparing a to-be-molded jointed panel, the to-be-molded jointed panel comprising:
      a circuit board panel comprising a plurality of circuit board units;
      a plurality of photosensitive elements mounted in a row on the circuit board panel, each of the photosensitive elements being located on one of the circuit board units, and each of the photosensitive elements having a first edge, the first edge being parallel to an arrangement direction of the photosensitive elements in a same row;
      a plurality of first metal wires electrically connecting each of the photosensitive elements and the circuit board unit corresponding to the photosensitive element, and the first metal wire spanning the first edge of the photosensitive element; and
      a plurality of first electronic elements respectively mounted on each of the circuit board units to block or slow down an impact of mold flow to the first metal wire during a molding process;
   step 2: pressing the to-be-molded jointed panel by a die to form a molding cavity between the die and the to-be-molded jointed panel; and
   step 3: injecting liquid molding material into the molding cavity to fill the molding cavity with the liquid molding material, and then forming a molding portion on the circuit board jointed panel,
   wherein an injection direction of the injected liquid molding material is parallel to the first edge, and
   wherein, in the step 1, a mounting area of the first electronic element is located on an extension line of the first edge of the corresponding photosensitive element to block or slow down the impact of the mold flow to the first metal wire during the molding process.

14. The method for manufacturing a photosensitive assembly jointed panel according to claim 13, wherein, in the step 2, the molding cavity comprises a plurality of molding cavity units, each of the molding cavity units corresponds to one of the circuits board units, and the plurality of molding cavity units communicate with each other.

15. The method for manufacturing a photosensitive assembly jointed panel according to claim 13,
   wherein, in the step 3, the molding portion surrounds each of the photosensitive elements, and the molding portion extends toward each of the photosensitive elements, covers the corresponding first electronic element and first metal wire, and contacts a surface of the photosensitive element, and
   wherein circuit board jointed panel areas between adjacent photosensitive elements are covered by the molding portion to form the molding portion as a whole.

16. The method for manufacturing a photosensitive assembly jointed panel according to claim 13,
   wherein, in the step 1, the circuit board panel is a soft-hard combination board, and the soft-hard combination board comprises at least one hard board area, and
   wherein the plurality of photosensitive elements are mounted on the hard board area.

17. The method for manufacturing a photosensitive assembly jointed panel according to claim 13, wherein, in the step 1, a connection line between each of the first terminal and the second terminal corresponding thereto is not perpendicular to the first edge.

* * * * *